United States Patent
Jung et al.

(10) Patent No.: US 10,584,239 B2
(45) Date of Patent: Mar. 10, 2020

(54) THERMOSETTING RESIN COMPOSITION FOR FREQUENCY, AND PREPREG, LAMINATED SHEET AND PRINTED CIRCUIT BOARD USING SAME

(71) Applicant: DOOSAN CORPORATION, Seoul (KR)

(72) Inventors: Dong Hee Jung, Yongin-si (KR); Jeong Don Kwon, Yongin-si (KR); Moo Hyun Kim, Yongin-si (KR); Do Woong Hong, Yongin-si (KR)

(73) Assignee: DOOSAN CORPORATION, Seoul (KR)

( * ) Notice: Subject to any disclaimer, the term of this patent is extended or adjusted under 35 U.S.C. 154(b) by 0 days.

(21) Appl. No.: 16/424,251

(22) Filed: May 28, 2019

(65) Prior Publication Data

US 2019/0284393 A1 Sep. 19, 2019

Related U.S. Application Data

(63) Continuation of application No. 15/538,488, filed as application No. PCT/KR2015/014030 on Dec. 21, 2015.

(30) Foreign Application Priority Data

Dec. 22, 2014 (KR) .................. 10-2014-0186496
Dec. 15, 2015 (KR) .................. 10-2015-0179108

(51) Int. Cl.

| | | |
|---|---|---|
| *C08L 71/02* | (2006.01) | |
| *C08J 5/24* | (2006.01) | |
| *C08J 5/04* | (2006.01) | |
| *B32B 27/28* | (2006.01) | |
| *C08G 65/48* | (2006.01) | |
| *C08K 3/28* | (2006.01) | |
| *C08J 5/08* | (2006.01) | |
| *C08K 9/06* | (2006.01) | |
| *C08K 5/00* | (2006.01) | |
| *H05K 3/02* | (2006.01) | |
| *H05K 1/03* | (2006.01) | |

(52) U.S. Cl.
CPC .............. *C08L 71/02* (2013.01); *B32B 27/28* (2013.01); *C08G 65/485* (2013.01); *C08J 5/04* (2013.01); *C08J 5/08* (2013.01); *C08J 5/24* (2013.01); *C08K 3/28* (2013.01); *C08K 5/00* (2013.01); *C08K 9/06* (2013.01); *H05K 3/022* (2013.01); *C08J 2371/12* (2013.01); *H05K 1/0373* (2013.01); *H05K 2201/012* (2013.01)

(58) Field of Classification Search
CPC .................. C08J 3/242; C08L 71/02
See application file for complete search history.

(56) References Cited

U.S. PATENT DOCUMENTS

| | | |
|---|---|---|
| 7,273,900 B2 | 9/2007 | Amou et al. |
| 8,404,769 B2 | 3/2013 | Fujimoto et al. |
| 2002/0077447 A1 | 6/2002 | Hwang et al. |
| 2003/0096123 A1* | 5/2003 | Yeager .................. C08F 283/08 428/461 |
| 2007/0129502 A1* | 6/2007 | Kawabe .................. B32B 15/08 525/391 |
| 2009/0239992 A1 | 9/2009 | Yamada et al. |
| 2009/0247032 A1* | 10/2009 | Mori .................... C08G 65/485 442/181 |
| 2010/0119716 A1 | 5/2010 | Chapman Irwin et al. |
| 2012/0315814 A1* | 12/2012 | Fung ........................ C08L 9/00 442/117 |
| 2014/0044918 A1 | 2/2014 | Zeng |
| 2015/0166788 A1 | 6/2015 | Li et al. |
| 2016/0297967 A1 | 10/2016 | Jung et al. |

FOREIGN PATENT DOCUMENTS

| | | |
|---|---|---|
| CN | 103467967 A | 12/2013 |
| EP | 2 595 460 A1 | 5/2013 |
| JP | 4-88054 A | 3/1992 |
| JP | 2004-156014 | 6/2004 |
| JP | 2008-510059 A | 4/2008 |
| JP | 2014-1276 | 1/2014 |
| JP | 2018-504511 | 2/2018 |
| JP | 2018-90681 | 6/2018 |
| TW | 201249902 A | 12/2012 |
| WO | 2014/203511 A1 | 12/2014 |

OTHER PUBLICATIONS

International Search Report for PCT/KR2015/014030 dated Apr. 18, 2016 PCT/ISA/210.
Japanese Patent Office; communication dated Jul. 20, 2018 issued in counterpart application No. 2017-551981.
State Intellectual Property Office of the P.R.C.; Communication dated Nov. 2, 2018 in application No. 201580068649.X.

* cited by examiner

*Primary Examiner* — Mark S Kaucher
(74) *Attorney, Agent, or Firm* — Sughrue Mion, PLLC

(57) ABSTRACT

A thermosetting resin composition for use with high frequencies is provided. The composition includes: (a) a polyphenylene ether having two or more unsaturated substituent groups selected from the group consisting of the vinyl group and the allyl group at both ends of the molecular chain thereof, or an oligomer of said polyphenylene ether; (b) three or more different types of cross-linking curing agents; and (c) a flame retardant. It is possible to provide a printed circuit board for use with high frequencies which simultaneously exhibits, inter alia, an outstanding low dielectric loss characteristic and good moisture-absorption heat resistance, low thermal expansion characteristics, thermal stability and outstanding working properties.

26 Claims, No Drawings

THERMOSETTING RESIN COMPOSITION FOR FREQUENCY, AND PREPREG, LAMINATED SHEET AND PRINTED CIRCUIT BOARD USING SAME

CROSS REFERENCE TO RELATED APPLICATIONS

This application is a Continuation of U.S. application Ser. No. 15/538,488, filed on Jun. 21, 2017, which is National Stage of International Application No. PCT/KR2015/014030, filed on Dec. 21, 2015, which claims priority from Korean Patent Application Nos. 10-2014-0186496, filed on Dec. 22, 2014, and 10-2015-0179108, filed on Dec. 15, 2015, the contents of all of which are incorporated herein by reference in their entirety.

TECHNICAL FIELD

The present disclosure relates to a novel thermosetting resin composition for high frequency which may simultaneously exhibit an excellent low dielectric loss characteristic, good moisture-absorption heat resistance, low thermal expansion characteristics, excellent thermal stability, and the like, and a prepreg, a functional laminated sheet and a copper-foil laminate using the same.

BACKGROUND ART

Recently, the signal band of an electronic part such as a semiconductor substrate, a printed circuit board, and an epoxy molding compound (EMC) and an information and communication device tends to increase. The transmission loss of electric signals is proportional to dielectric loss tangent and frequency. Accordingly, a higher frequency increases the transmission loss and brings about attenuation of signals, thereby leading to deterioration in the reliability of signal transmission. Further, the transmission loss is converted into heat, and thus, a problem of heat generation may also be caused. For that reason, there is a need for an insulation material having a very low dielectric loss tangent in a high frequency region.

In addition, as the demand for high integration, high refinement, high performance, and the like in the semiconductor device and PCB fields is currently increased, the condition is gradually changed into a situation in which the integration of semiconductor devices, the high density of printed circuit boards, and the simplicity of wiring interval are simultaneously required. In order to satisfy these characteristics, it is preferred to use a material having a low permittivity which allows a transmission rate to be increased and a low dielectric loss characteristics for reducing a transmission loss.

To exhibit these low dielectric characteristics, a poly(phenylene ether) resin having excellent dielectric characteristics is applied, but has a problem with a high melt viscosity, a difficulty in handleability, molding processability of a prepreg, and the like. Furthermore, there have been no studies on a method for effectively cross-linking a thermoplastic resin such as a poly(phenylene ether) resin having excellent dielectric characteristics.

DISCLOSURE

Technical Problem

The present disclosure has been contrived to solve the aforementioned problems, and prepared a thermosetting resin composition having excellent overall physical properties including heat resistance and low permittivity characteristics by using a poly(phenylene ether) resin, which has both sides of the molecular chain thereof modified with an unsaturated bond substituent group, and three or more specific cross-linking curing agents in combination.

Thus, an object of the present disclosure is to provide a thermosetting resin composition which exhibits excellent heat resistance and low dielectric characteristics, and a prepreg, a laminated sheet and a printed circuit board using the composition.

Technical Solution

The present disclosure provides a thermosetting resin composition for use with high frequencies, the composition including: (a) a poly(phenylene ether) having two or more unsaturated substituent groups selected from the group consisting of a vinyl group and an allyl group at both ends of the molecular chain thereof, or an oligomer of the poly(phenylene ether); (b) three or more different types of cross-linking curing agents; and (c) a flame retardant.

The thermosetting resin composition for use with high frequencies may further include an inorganic filler surface-treated with a vinyl group-containing silane coupling agent.

According to an example, the cross-linking curing agent may be a mixture of a hydrocarbon-based cross-linking agent (b1), a cross-linking agent containing three or more functional groups (b2) and a rubber having a block structure (b3).

Further, the present disclosure provides a prepreg including: a fibrous substrate surface-treated with a vinyl group-containing silane coupling agent; and the aforementioned thermosetting resin composition impregnated in the fibrous substrate.

In addition, the present disclosure provides a functional laminated sheet including: a metal foil or a polymer film substrate; and a resin layer which is formed on one surface or both surfaces of the substrate and cured by the aforementioned thermosetting resin composition.

Furthermore, the present disclosure provides a printed circuit board laminated and molded by including the prepreg having one or more layers.

Advantageous Effects

A thermosetting resin composition according to the present disclosure simultaneously satisfies the improvement in glass transition temperature (Tg), a low coefficient of thermal expansion (CTE), low dielectric characteristics, a low dielectric loss, high heat resistance, and excellent processability, and as a result, a printed circuit board using the same may exhibit excellent high frequency characteristics, good moisture-absorption heat resistance, and low thermal expansion characteristics.

Accordingly, the thermosetting resin composition of the present disclosure may be usefully utilized for parts of a printed circuit board used in various electric and electronic devices such as a mobile communication device which handles high-frequency signals of 1 GHz or more or a base station device thereof, a network-related electronic device such as a server and a router, and a large computer.

BEST MODE

Hereinafter, the present disclosure will be described in detail.

The present disclosure has been made in an effort to provide a thermosetting resin composition which may be usefully utilized for a printed circuit board, particularly, a multi-layer printed circuit board for use with high frequencies.

Since the dielectric loss of electric signal is proportional to the product of the square root of a relative permittivity of an insulating layer which forms a circuit, the dielectric loss tangent, and the frequency of electric signal, the dielectric loss is increased as the frequency of the electric signal becomes high. Accordingly, in order to be used for an insulating layer of a high-frequency printed circuit board, a material having a low permittivity and a low dielectric loss factor (dielectric loss) is required to be used. In order to implement a low dielectric polymer material due to these requirements, board materials for use with frequencies, to which a decrease in hydroxy groups of an epoxy resin, a plan to cross-link a thermoplastic resin, an application of a liquid crystal polymer or polyimide, and the like are applied, have been developed, but the board materials have dielectric characteristics which are insufficient for satisfying high frequency characteristics, or have difficulty in molding a board.

Thus, the present disclosure intends to use poly(phenylene ether) (PPE) as a constituent component of a thermosetting resin composition in order to satisfy the aforementioned low dielectric characteristics and dielectric loss characteristics. But in of view low heat resistance, and an increase in viscosity of a PPE resin melt are caused when the PPE is used, in the present disclosure, a poly(phenylene ether) in which both ends of the molecular chain thereof are modified with a vinyl group or an allyl group, which is an unsaturated bond substituent group, is used with three or more specific cross-linking curing agents.

More specifically, the present disclosure enables an unsaturated bond by modifying both ends of poly(phenylene ether) with a vinyl group, an allyl group, and the like. A cross-linking reaction may be generated by heat, thereby contributing to improvement in heat resistance and suppressing an insulating layer from being deformed and flowing. Further, it is possible to satisfy moisture resistance and dielectric characteristics due to the improvement in glass transition temperature (Tg), a low coefficient of thermal expansion (CTE), and a decrease in —OH (hydroxy) group, to enable being applied in an existing thermosetting system, and to simultaneously secure various physical properties and processability through studies on dielectric characteristics and the like according to the characteristics of a cross-linking agent.

Further, the present disclosure may use, as a base resin, poly(phenylene ether) (PPE) with an enhanced compatibility by modifying the PPE having excellent dielectric characteristics as described above to have a low molecular weight through a redistribution reaction, and then treating both ends thereof with a vinyl group, and use three or more cross-linking curing agents having excellent dielectric characteristics, thereby implementing not only low dielectric characteristics through a radical polymerization, but also excellent heat resistance characteristics and mechanical characteristics (see the following Table 3).

According to an example, it is possible to use a hydrocarbon-based cross-linking agent, a cross-linking agent containing three or more functional groups, and a rubber having a block structure in mixture as the three or more cross-linking curing agents.

Here, the hydrocarbon-based cross-linking agent has low polarization characteristics, and thus not only may implement low dielectric characteristics, but also has excellent molding processability due to the flowability. Further, the resin composition of the present disclosure has an elastomer property due to the hydrocarbon-based cross-linking agent when the composition is cured, and thus is effective for drill abrasion resistance during the drill processing. When the hydrocarbon-based cross-linking agent is used together with a cross-linking agent containing three or more functional groups (hereinafter, referred to as 'a three or more functional groups-containing cross-linking agent'), the volume backbone of the resin itself is increased due to the three or more functional groups-containing cross-linking agent. And accordingly, a synergy effect with the hydrocarbon-based curing agent is exhibited, and thus, it is possible to implement lower dielectric characteristics than the case where the hydrocarbon-based cross-linking agent is used alone, and it is also possible to improve heat resistance characteristics due to an increase in cross-linking density. In addition, when a rubber having a block structure, for example, a styrene-butadiene rubber is used in combination with the cross-linking agents, it is also possible to improve mechanical characteristics because a rigid structure such as styrene in a polymer chain serves as a domain after the resin composition is cured. Particularly, when a copolymer containing a styrene-based unit and a butadiene-based unit (for example, a styrene-butadiene rubber) is used, it is possible to simultaneously implement the advantages of the processability of styrene and the impact resistance and chemical resistance of butadiene.

<Thermosetting Resin Composition>

The thermosetting resin composition according to the present disclosure is a non-epoxy-based thermosetting resin composition, and includes: (a) a poly(phenylene ether) having two or more unsaturated substituent groups selected from the group consisting of a vinyl group and an allyl group at both ends of the molecular chain thereof, or an oligomer of the poly(phenylene ether); (b) three or more cross-linking curing agents; and (c) a flame retardant. Further, the thermosetting resin composition may further include an inorganic filler surface-treated with a vinyl group-containing silane coupling agent. In this case, the thermosetting resin composition may further include a curing accelerator, an initiator (for example, a radical initiator), and the like, if necessary.

(a) Poly(phenylene ether)

The thermosetting resin composition according to the present disclosure includes poly(phenylene ether) (PPE) or an oligomer of the poly(phenylene ether). The PPE or the oligomer of the PPE has two or more vinyl groups, two or more allyl groups, or both the vinyl groups and the allyl groups at both ends of the molecular chain thereof, and may be used without particular limitation in structure.

In the present disclosure, an allylated poly(phenylene ether) represented by the following Formula 1 is preferred. The reason is that the both sides of the molecular chain thereof are modified to be two or more vinyl groups, and as a result, it is possible to satisfy moisture resistance characteristics and dielectric characteristics due to improvement in glass transition temperature, a low coefficient of thermal expansion, and a decrease in —OH group.

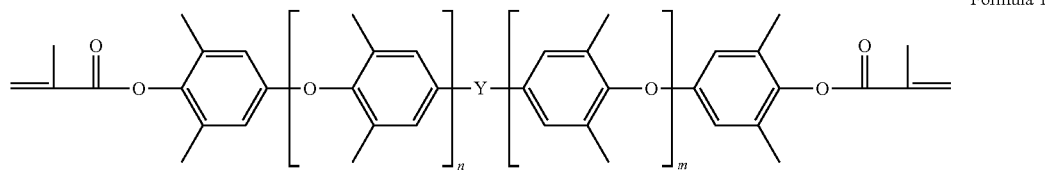

Formula 1

In Formula 1,

Y is one or more compounds selected from the group consisting of bisphenol A-type, bisphenol F-type, bisphenol S-type, naphthalene-type, anthracene-type, biphenyl-type, tetramethyl biphenyl-type, phenol novolac-type, cresol novolac-type, bisphenol A novolac-type, and bisphenol S novolac-type compounds, and m and n are each independently a natural number from 3 to 20.

In the present disclosure, a poly(phenylene ether) having two or more vinyl groups at both ends of the molecular chain thereof is usually used, but the use of a typical unsaturated double bond moiety known in the art other than the vinyl group also falls within the scope of the present disclosure.

Meanwhile, since the poly(phenylene ether) inherently has a high melting point, the viscosity of the melt of the resin composition is high, and as a result, it is difficult to produce a multi-layer sheet. Thus, in the present disclosure, it is preferred to use a form which is modified to have a low molecular weight through a redistribution reaction instead of using a poly(phenylene ether) having a high molecular weight in the related art as it is.

In particular, when a poly(phenylene ether) having a high molecular weight in the related art is modified into a poly(phenylene ether) resin having a low molecular weight, a phenol-derived compound or a compound such as bisphenol A is generally used. In this case, the compound can be rotated due to the molecular structure, and as a result, there occurs a phenomenon in which the permittivity deteriorates.

Meanwhile, instead of a poly(phenylene ether) (PPE) resin having a high molecular weight conventionally used, in the present disclosure, a modified poly(phenylene ether) resin is used which has a low molecular weight through a redistribution reaction by using specific bisphenol compounds in which the contents of an alkyl group and an aromatic ring group are increased. In the present disclosure, a vinyl group is introduced into both ends of the resin through the redistribution reaction. In this case, the redistribution reaction is carried out in the presence of a radical initiator, a catalyst, or a radical initiator and a catalyst.

Specifically, a poly(phenylene ether) for a copper-foil laminate in the related art is used by being modified a high-molecular weight poly(phenylene ether) into a low-molecular weight poly(phenylene ether) having an alcohol group at both ends through a redistribution reaction which uses polyphenol, and a radical initiator as a catalyst. But, there is a limitation in implementing low dielectric loss characteristics due to the structural characteristics of bisphenol A, which is a polyphenol used in the redistribution in the related art, and the high polarity of the alcohol groups at both ends, which are produced after the redistribution.

In contrast, in the present disclosure, a polyphenol used in the redistribution reaction is redistributed by the specific bisphenol compounds in which the contents of an alkyl group and an aromatic ring group are increased. After redistribution by using the specific bisphenol compounds, the alcohol groups positioned at both ends are deformed into a vinyl group having a low polarity. As a result, it is possible to obtain a poly(phenylene ether) having a low dielectric loss even after the poly(phenylene ether) is cross-linked. Since the modified poly(phenylene ether) has a lower molecular weight and a higher content of an alkyl group than the existing polyphenylene-derived compounds, the compatibility with the existing epoxy resin and the like is excellent and the flowability is increased when a laminate is manufactured, and as a result, the processing properties are improved and the dielectric characteristics are additionally improved. Accordingly, a printed circuit board manufactured by using the resin composition of the present disclosure has an advantage in that the physical properties such as moldability, processability, dielectric characteristics, heat resistance, and bond strength are improved.

In this case, as the specific bisphenol compound in which the content of an alkyl group and the content of an aromatic ring group are increased, it is possible to use a bisphenol-based compounds except for bisphenol A BPA, 2,2-bis(4-hydroxyphenyl)propane without limitation. Non-limiting examples of an available bisphenol compound include bisphenol AP (1,1-bis(4-hydroxyphenyl)-1-phenyl-ethane), bisphenol AF (2,2-bis(4-hydroxyphenyl)hexafluoropropane), bisphenol B (2,2-bis(4-hydroxyphenyl)butane), bisphenol BP (bis-(4-hydroxyphenyl)diphenylmethane), bisphenol C (2,2-bis(3-methyl-4-hydroxyphenyl)propane), bisphenol C (bis(4-hydroxyphenyl)-2,2-dichloroethylene), bisphenol G (2,2-bis(4-hydroxy-3-isopropyl-phenyl)propane), bisphenol M (1,3-bis(2-(4-hydroxyphenyl)-2-propyl)benzene), bisphenol P (bis(4-hydroxyphenyl)sulfone), bisphenol PH (5,5'-(1-methylethyliden)-bis 1,1'-(bisphenyl)-2-olpropane), bisphenol TMC (1,1-bis(4-hydroxyphenyl)-3,3,5-trimethyl-cyclohexane), bisphenol Z (1,1-bis(4-hydroxyphenyl)-cyclohexane) or a mixture of one or more thereof, and the like.

The poly(phenylene ether) resin (a) may be a poly(phenylene ether) resin which is modified to have a low molecular weight in which the number average molecular weight (Mn) is in a range of 1,000 to 10,000, preferably, 1,000 to 5,000, more preferably, 1,000 to 3,000, by carrying out a redistribution reaction on a poly(phenylene ether) resin having a high molecular weight in which the number average molecular weight is in a range of 10,000 to 30,000, in the presence of a bisphenol-based compound except for bisphenol A.

Further, the molecular weight distribution of the poly(phenylene ether) is suitably 3 or less (Mw/Mn<3), and may be preferably in a range of 1.5 to 2.5. In the thermosetting resin composition according to the present disclosure, the content of the poly(phenylene ether) resin or an oligomer of the poly(phenylene ether) may be about 20 to 50 wt% based on the total weight of the resin composition.

(b) Cross-Linking Curing Agent

The thermosetting resin composition according to the present disclosure includes three or more different cross-linking curing agents.

The cross-linking curing agent forms a network structure by 3-dimensionally cross-linking the poly(phenylene ether). Even though a poly(phenylene ether) modified to have a low molecular weight is used in order to increase the fluidity of the resin composition, the heat resistance of the poly(phenylene ether) may be improved due to the use of three or more cross-linking curing agents. In addition, the cross-linking curing agent may implement low permittivity and dielectric loss characteristics, enhance the fluidity of the thermosetting resin composition, and improve a peeling strength with another substrate (for example, a copper foil) by cross-linking PPE.

The cross-linking curing agent may be selected from the group consisting of a hydrocarbon-based cross-linking agent (b1), a cross-linking agent containing three or more functional groups (b2), and rubber having a block structure (b3).

According to an example, as the cross-linking curing agent, a hydrocarbon-based cross-linking agent (b1), a cross-linking agent containing three or more functional groups (b2) and a rubber having a block structure (b3) may be used in mixture.

The hydrocarbon-based cross-linking agent available in the present disclosure is not particularly limited as long as the hydrocarbon-based cross-linking agent is a hydrocarbon-based cross-linking agent having a double bond or a triple bond, and may be preferably a diene-based cross-linking agent. Specific examples thereof include butadiene (for example, 1,2-butadiene, 1,3-butadiene, and the like) or a polymer thereof, decadiene (for example, 1,9-decadiene, and the like) or a polymer thereof, octadiene (for example, 1,7-octadiene, and the like) or a polymer thereof, vinyl carbazole, and the like, and these may be used either alone or in mixture of two or more thereof.

According to an example, a polybutadiene represented by the following Formula 2 may be used as the hydrocarbon-based cross-linking agent.

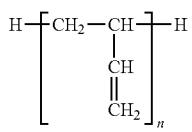

Formula 2

(In Formula 2, n is an integer from 10 to 30)

The hydrocarbon-based cross-linking agent may have a molecular weight (Mw) in a range of 500 to 3,000, preferably 1,000 to 3,000.

Non-limiting examples of a cross-linking agent containing three or more (preferably three to four) functional groups available in the present disclosure include triallyl isocyanurate (TAIL), 1,2,4-trivinyl cyclohexane (TVCH), and the like, and these may be used either alone or in mixture of two or more thereof.

According to an example, as a cross-linking agent containing three or more functional groups, a triallyl isocyanurate (TAIC) represented by the following Formula 3 may be used.

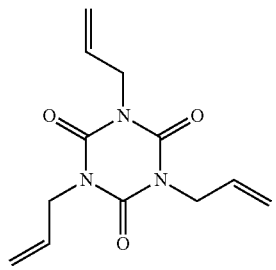

Formula 3

A rubber having a block structure available in the present disclosure is in the form of a block copolymer, and may be preferably a rubber in the form of a block copolymer containing a butadiene unit, more preferably a rubber in the form of a block copolymer containing a unit, such as a styrene unit, an acrylonitrile unit, and an acrylate unit, together with a butadiene unit. Non-limiting examples thereof include styrene-butadiene rubber (SBR), acrylonitrile-butadiene rubber, acrylate-butadiene rubber, acrylonitrile-butadiene-styrene rubber, and the like, and these may be used either alone or in mixture of two or more thereof.

According to an example, as the rubber having a block structure, a styrene-butadiene rubber represented by the following Formula 4 may be used.

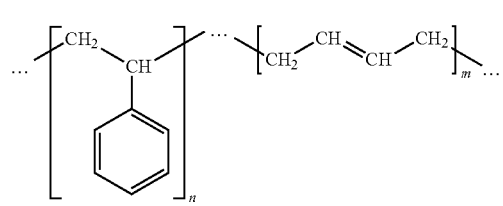

Formula 4

(In Formula 4, n is an integer from 5 to 20 and m is an integer from 5 to 20).

In the thermosetting resin composition of the present disclosure, the content of the cross-linking curing agent (b) is not particularly limited, but may be in a range of about 5 to 45 wt %, preferably about 10 to 30 wt %, based on the total weight of the resin composition. When the content of the cross-linking curing agent corresponds to the aforementioned range, low dielectric characteristics, curability, molding processability and bond strength of the resin composition are good.

According to an example, when as the three or more cross-linking curing agents, a hydrocarbon-based cross-linking agent (b1), a cross-linking agent containing three or more functional groups (b2), and a rubber having a block structure (b3) are used in mixture, the contents of the hydrocarbon-based cross-linking agent (b1), the cross-linking agent containing three or more functional groups (b2), and the rubber having a block structure (b3) may be each in a range of about 1.65 to 15 wt %, preferably about 3.33 to 10 wt %, and more preferably about 5 to 10 wt %, based on the total weight of the resin composition.

According to another example, when as the three or more cross-linking curing agents, a hydrocarbon-based cross-linking agent (b1), a cross-linking agent containing three or more functional groups (b2), and a rubber having a block structure (b3) are used in mixture, the mixing ratio of the hydrocarbon-based cross-linking agent (b1), the cross-linking agent containing three or more functional groups (b2), and the rubber having a block structure (b3) may be a weight ratio of b1:b2:b3=1 to 20:1 to 20:1, preferably b1:b2:b3=1 to 7:1 to 7:1.

If necessary, the present disclosure may further include a typical cross-linking curing agent known in the art, in addition to the hydrocarbon-based curing agent, the three or more functional groups-containing cross-linking agent, and the rubber having a block structure. In this case, the cross-linking curing agent is preferably a cross-linking curing agent having excellent miscibility with a poly(phenylene ether) in which the sides thereof are modified with a vinyl group, an allyl group, and the like.

Non-limiting examples of an available cross-linking curing agent include divinyl naphthalene, divinyl diphenyl, a styrene monomer, phenol, triallyl cyanurate (TAC), di-(4-vinylbenzyl) ether (the following Formula 5), and the like. In this case, the aforementioned curing agents may be used either alone or in mixture of two or more thereof.

Formula 5

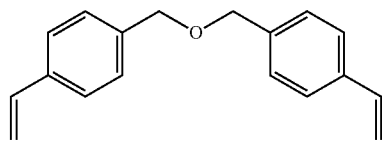

In the present disclosure, low dielectric characteristics, various physical properties, and processability may be maximized by appropriately using the aforementioned cross-linking curing agents in mixture and adjusting the optimized content thereof. In particular, in the present disclosure, the adjustment of the viscosity may be facilitated by using, at an optimized content, di-(4-vinylbenzyl) ether (Chemical Formula 5), which exhibits an initiation delaying reaction effect as a cross-linking bonding agent, in mixture with other cross-linking curing agents (a hydrocarbon-based curing agent, a three or more functional groups-containing curing agent, and a rubber having a block structure). It is possible to overcome the difficulty in handleability or molding processability of a prepreg by adjusting the resin flowability based on the facilitation of adjusting the viscosity.

Specifically, when di-(4-vinylbenzyl) ether is used in mixture with a hydrocarbon-based curing agent, a three or more functional groups-containing curing agent, and a rubber having a block structure as a cross-linking curing agent, low dielectric characteristics and the flowing characteristics by adjusting the content may be simultaneously secured. In this case, the hydrocarbon-based curing agent, the three or more functional groups-containing curing agent, and the rubber having a block structure may be each used in an amount in a range of about 1.65 to 15 wt %, preferably about 3.33 to 10 wt %, and more preferably 5 to 10 wt %, based on the total weight of the resin composition, and di-(4-vinylbenzyl) ether may be used in an amount in a range of about 1 to 10 wt %, preferably about 2 to 5 wt %, based on the total weight of the resin composition.

(c) Flame Retardant

The thermosetting resin composition according to the present disclosure includes a flame retardant (c).

As the flame retardant, a typical flame retardant known in the art may be used without limitation, and examples thereof include: a halogen flame retardant containing bromine or chlorine; a phosphorus-based flame retardant such as triphenyl phosphate, tricresyl phosphate, trisdichloropropylosphate, and phosphagen; an antimony-based flame retardant such as antimony trioxide; an inorganic flame retardant such as a metal hydroxide such as aluminum hydroxide and magnesium hydroxide, and the like. In the present disclosure, an addition-type bromine flame retardant, which has no reactivity with poly(phenylene ether) and does not degrade heat resistance characteristics and dielectric characteristics, is suitable.

Characteristics of a curing agent and flame-retarding characteristics may be simultaneously obtained by using, as a brominated flame retardant in the present disclosure, bromophthalimide, a bromophenyl addition-type bromine flame retardant or tetrabromo bisphenol A allyl ether in the allyl terminated form, and a flame-retarding curing agent in the form of divinylphenol. Further, a brominated organic compound may also be used, and specific examples thereof include decabromodiphenyl ethane, 4,4-dibromobiphenyl, ethylenebistetrabromophthalimide, and the like.

In the thermosetting resin composition according to the present disclosure, the content of the flame retardant may be included in an amount in a range of about 10 to 30 wt %, preferably about 10 to 20 w %, based on the total weight of the resin composition. When the flame retardant is included in an amount in the range, sufficient flame resistance at the flame retardancy 94V-0 level may be obtained, and excellent heat resistance and electrical characteristics may be exhibited.

(d) Inorganic Filler Surface-Treated with Vinyl Group-Containing Silane Coupling Agent The thermosetting resin composition according to the present disclosure may further include an inorganic filler surface-treated with a vinyl group-containing silane coupling agent.

The inorganic filler is an inorganic filler whose surface is treated with a vinyl group-containing silane coupling agent, and has excellent compatibility with a poly(phenylene ether) containing a vinyl group and/or an allyl group at both ends thereof, so that it is possible to further improve moisture-absorption heat resistance and processability while lowering dielectric characteristics. Further, the inorganic filler reduces a difference in coefficient of thermal expansion (CTE) between a resin layer and another layer and thus may effectively enhance warpage characteristics, low expansion, mechanical strength (toughness), and low stress of a final product.

The inorganic filler (d) available in the present disclosure is an inorganic filler known in the art, and is not particularly limited as long as the inorganic filler (d) is an inorganic filler whose surface is treated with a vinyl group-containing silane coupling agent. Examples thereof include silicas, such as natural silica, fused silica, amorphous silica, and crystalline silica, boehmite, alumina, talc, spherical glass, calcium carbonate, magnesium carbonate, magnesia, clay, calcium silicate, titanium oxide, antimony oxide, glass fiber, aluminum borate, barium titanate, strontium titanate, calcium titanate, magnesium titanate, bismuth titanate, titanium oxide, barium zirconate, calcium zirconate, boron nitride, silicon nitride, talc, mica, and the like, and the surface thereof is treated with a vinyl group-containing silane coupling agent. These inorganic fillers may be used either alone or in mixture of two or more thereof. Among the inorganic fillers, fused silica exhibiting a low coefficient of thermal expansion is preferred.

The method for preparing the inorganic filler surface-treated with the vinyl group-containing silane coupling agent is not particularly limited, and the inorganic filler may be prepared by a typical method known in the art. As an example, the inorganic filler surface-treated with the vinyl group-containing silane coupling agent may be prepared by introducing an inorganic filler into a solution including a vinyl group-containing silane coupling agent and then drying the filler.

The size of the inorganic filler (d) is not particularly limited, but is advantageous in terms of dispersibility when the average particle diameter is in a range of about 0.5 to 5 μm.

In addition, the content of the inorganic filler is not particularly limited, and may be appropriately adjusted in consideration of the aforementioned warpage characteristics, mechanical properties, and the like. As an example, the content of the inorganic filler is preferably in a range of about 10 to 50 wt % based on the total weight of the thermosetting resin composition. If the content of the inorganic filler is too high, the moldability may deteriorate.

Meanwhile, the thermosetting resin composition according to the present disclosure may further include a reaction initiator in order to strengthen an advantageous effect of a cross-linking curing agent.

The reaction initiator may further accelerate the curing of the poly(phenylene ether) and the cross-linking curing agent, and may enhance characteristics such as heat resistance of the resin.

Non-limiting examples of an available reaction initiator include α,α'-bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoxyquinone, chloranil, 2,4,6-tri-t-butylphenoxyl, t-butylperoxyisopropyl monocarbonate, azobisisobutylonitrile, and the like, and additionally, a metal carboxylate salt may be further used.

The content of the reaction initiator may be about 2 to 5 parts by weight based on 100 parts by weight of a poly(phenylene ether), but the content thereof is not limited thereto.

Furthermore, the thermosetting resin composition of the present disclosure may further include a curing accelerator.

Examples of the curing accelerator include an organic metal salt or an organic metal complex including one or more metals selected from the group consisting of iron, copper, zinc, cobalt, lead, nickel, manganese, and tin.

Specific examples of the organic metal salt or the organic metal complex include iron naphthenates, copper naphthenates, zinc naphthenates, cobalt naphthenates, nickel naphthenates, manganese naphthenates, tin naphthenates, zinc octanoate, tin octanoate, iron octanoate, copper octanoate, zinc 2-ethylhexanate, lead acetylacetonate, cobalt acetylacetonate, or dibutyl tin maleate and the like, but the examples are not limited thereto. Further, these organic metal salts or organic metal complexes may be used alone or in mixture of two or more thereof.

The content of the curing accelerator may be in a range of about 0.01 to 1 part by weight based on 10 to 60 parts by weight of a poly(phenylene ether), but the content thereof is not limited thereto.

In addition to the aforementioned components, the thermosetting resin composition of the present disclosure may additionally include a flame retardant generally known in the art, various polymers such as other thermosetting resins or thermoplastic resins, which are not described above, and oligomers thereof, other additives such as solid rubber particles or an ultraviolet absorber, an antioxidant, a polymerization initiator, a dye, a pigment, a dispersing agent, a thickener, and a leveling agent, and the like, if necessary, without impairing inherent characteristics of the resin composition. Example thereof include: an organic filler such as a silicone-based powder, a nylon powder, and a fluorine resin powder, and a thickener such as ORBEN and BENTON; a polymer-based antifoaming agent such as silicone-based and fluorine resin-based antifoaming agents or a leveling agent; an adhesion imparting agent such as imidazole-based, thiazole-based, triazole-based, and silane-based coupling agents; a coloring agent such as phthalocyanine and carbon black, and the like.

For the purpose of imparting appropriate flexibility to the resin composition after curing, a thermoplastic resin may be blended with the thermosetting resin composition. Examples of the thermoplastic resin include a phenoxy resin, a polyvinylacetal resin, polyimide, polyamideimide, polyethersulfone, polysulfone, and the like. These thermoplastic resins may be used either alone or in combination of two or more thereof.

Examples of the resin additive include: an organic filler such as a silicone powder, a nylon powder, and a fluorine powder; a thickener such as ORBEN and BENTON; a polymer-based antifoaming agent such as silicone-based and fluorine-based antifoaming agents or a leveling agent; an adhesion imparting agent such as imidazole-based, thiazole-based, triazole-based, and silane-based coupling agents, epoxysilane, aminosilane, alkylsilane, and mercaptosilane; a coloring agent such as phthalocyanine•blue, phthalocyanine•green, iodine•green, disazo yellow, and carbon black; a release agent such as higher fatty acids, higher fatty acid metal salts, and ester-based wax; a stress reliever such as modified silicone oil, silicone powder, and silicone resin, and the like. Further, the examples may include additives typically used in a thermosetting resin composition used for producing electronic devices (particularly, printed wiring boards).

According to an example of the present disclosure, the thermosetting resin composition may include: (a) about 20 to 50 parts by weight of a poly(phenylene ether) resin having two or more unsaturated substituent groups at both ends of the molecular chain thereof; (b) about 5 to 45 parts by weight of three or more cross-linking curing agents; and (c) about 10 to 30 parts by weight of a flame retardant, based on 100 parts by weight of the composition, and may satisfy the total 100 parts by weight by further including other organic solvents or other components. In this case, the basis of the constituent components may be the total weight of the composition, or may also be the total weight of a varnish including an organic solvent.

According to another example of the present disclosure, the thermosetting resin composition may include: (a) about 20 to 50 parts by weight of a poly(phenylene ether) resin having two or more unsaturated substituent groups at both ends of the molecular chain thereof; (b) about 5 to 45 parts by weight of three or more cross-linking curing agents; (c) about 10 to 30 parts by weight of a flame retardant; and (d) about 10 to 50 parts by weight of an inorganic filler surface-treated with a vinyl group-containing silane coupling agent, based on 100 parts by weight of the composition, and may satisfy the total 100 parts by weight by further including other organic solvents or other components. In this case, the basis of the constituent components may be the total weight of the composition, or may also be the total weight of a varnish including an organic solvent.

As an organic solvent available in the present disclosure, a typical organic solvent known in the art may be used without limitation, and examples thereof include acetone, cyclohexanone, methyl ethyl ketone, toluene, xylene, tetrahydrofuran, and the like, and these organic solvents may be used either alone or in mixture of two or more thereof.

The content of the organic solvent may be in a range of the balance which satisfies the total 100 parts by weight of the varnish by using the composition ratios of the aforementioned composition, and is not particularly limited.

<Prepreg>

A prepreg of the present disclosure includes: a fibrous substrate surface-treated with a vinyl group-containing silane coupling agent; and the aforementioned thermosetting resin composition impregnated in the fibrous substrate. Here, the thermosetting resin composition may also be a resin varnish in the form of being dissolved or dispersed in a solvent.

According to the present disclosure, when the thermosetting resin composition is impregnated in the fibrous substrate surface-treated with the vinyl group-containing silane coupling agent, the entire components (that is, a resin and optionally an inorganic filler) constituting the fibrous substrate and the composition include a vinyl group, so that the compatibility among the entire components is excellent. And thus, dielectric characteristics are improved, and moisture-absorption heat resistance and processability are further improved, and as a result, a material for high frequencies may be developed.

The fibrous substrate available in the present disclosure is a fibrous substrate known as a substrate of a prepreg in the art, and is not particularly limited as long as the fibrous substrate is a fibrous substrate whose surface is treated with a vinyl group-containing silane coupling agent. Examples thereof include an inorganic material fibrous substrate, an organic material fibrous substrate, or a mixed form thereof, which is arbitrarily bendable, has flexibility, and is typical in the art, and the surfaces of the fibrous substrates are treated with a vinyl group-containing silane coupling agent. In this case, the aforementioned fibrous substrate may be selected depending on the use of performance to be used.

Specific examples of the fibrous substrate include: an inorganic fiber such as glass fiber, i.e. E-glass, D-glass, S-glass, NE-glass, T-glass, and Q-glass, and carbon fiber; an organic fiber such as polyimide, polyamide, polyester, aramid fiber, an aromatic polyester, and a fluorine resin; a mixture of the inorganic fiber and the organic fiber; paper, nonwoven fabric, and woven fabric, which are composed of the inorganic fiber and/or the organic fiber, and mats such as roving, chopped strand mat, and surfacing mat. These substrates are a substrate whose surface is a vinyl group-containing silane coupling agent as described above, and may be used either alone or in mixture of two or more thereof. In addition, when a reinforced fibrous substrate is used in mixture, the rigidity and dimensional stability of the prepreg may be improved.

According to an example of the present disclosure, it is possible to use, as the fibrous substrate, glass fiber, glass paper, glass fiber nonwoven fabric (glass web), glass cloth, aramid fiber, aramid paper, polyester fiber, carbon fiber, inorganic fiber, organic fiber, and a mixture thereof.

The thickness of the fibrous substrate is not particularly limited, and may be, for example, in a range of about 0.01 to 0.3 mm.

As a method for treating the surface of the fibrous substrate with a vinyl group-containing silane coupling agent, the fibrous substrate may be prepared by a typical method known in the art, and as an example, the fibrous substrate may be prepared as in the aforementioned method for preparing an inorganic filler surface-treated with a vinyl group-containing silane coupling agent.

The method for preparing the prepreg of the present disclosure is not particularly limited, and the prepreg may be prepared by a preparation method known in the art.

In general, the prepreg refers to a sheet-like material obtained by coating or impregnating a fibrous substrate, which is surface-treated with a vinyl group-containing silane coupling agent, with the aforementioned thermosetting resin composition, and then curing the fibrous substrate to the B-stage (half-curing state) by means of heating. In this case, the heating temperature and time are not particularly limited, and as an example, the heating temperature may be in a range of about 20 to 200° C., preferably about 70 to 170° C., and the heating time may be in a range of about 1 to 10 minutes.

In addition to the aforementioned method, the prepreg of the present disclosure may be prepared by a hot-melt method, a solvent method, and the like, which are publicly known in the art.

The solvent method is a method in which a fibrous substrate is impregnated with a resin composition varnish formed by dissolving a thermosetting resin composition for forming a prepreg in an organic solvent, and then dried. When the solvent method is adopted, a resin varnish is generally used. Examples of the method for impregnating the resin composition in a fibrous substrate include a method for immersing a substrate in a resin varnish, a method for applying a resin varnish onto a substrate by various coaters, a method for spraying a resin varnish onto a substrate by spray, and the like. In this case, when the fibrous substrate is immersed in the resin varnish, the impregnating property of the resin composition for the fibrous substrate may be improved, which is preferred.

When the resin composition varnish is prepared, examples of the organic solvent include: ketones such as acetone, methyl ethyl ketone and cyclohexanone; acetic acid esters such as ethyl acetate, butyl acetate, cellosolve acetate, propylene glycol monomethyl ether acetate, and carbitol acetate; carbitols such as cellosolve and butyl carbitol; aromatic hydrocarbons such as toluene and xylene; dimethylformamide, dimethylacetamide, N-methylpyrrolidone, tetrahydrofuran, and the like. The organic solvents may be used either alone or in combination of two or more thereof.

Further, the hot-melt method may be a method in which a resin composition is not dissolved in an organic solvent, but is coated onto a release paper having excellent peeling property with the resin composition, and then the resulting release paper is laminated on a sheet-like fibrous substrate, or the resin composition is directly coated onto the sheet-like fibrous substrate by a die coater. In addition, the prepreg may also be prepared by continuously thermally laminating an adhesion film, which is composed of a thermosetting resin composition laminated on a support from both surfaces of a sheet-like reinforced substrate under heated and pressurized conditions.

According to an example of the present disclosure, a prepreg, preferably, a prepreg for a printed circuit board may be prepared by coating a sheet-like fibrous substrate, which is composed of fiber, or a glass substrate which is surface-treated with a vinyl group-containing silane coupling agent with the aforementioned thermosetting resin composition or impregnating the thermosetting resin composition in the substrate, and then half-curing the substrate by heating at a temperature of about 70 to 170° C. for about 1 to 10 minutes. In this case, the thermosetting resin composition may be prepared using a resin varnish.

<Laminated Sheet>

A laminated sheet according to the present disclosure includes: a metal foil or a polymer film substrate; and a resin layer which is formed on one surface or both surfaces of the substrate and cured by the thermosetting resin composition.

An example thereof includes a resin-attached copper foil including: a metal foil; and a resin layer which is formed on one surface or both surfaces of the metal foil and cured by the thermosetting resin composition.

As the metal foil, a metal foil composed of a typical metal or alloy known in the art may be used without limitation. In this case, when the metal foil is a copper foil, a laminate formed by coating and drying the thermosetting resin composition according to the present disclosure may be used as a copper foil laminate. The metal foil is preferably a copper foil. Examples of an available copper foil include CFL (TZA_B, HFZ_B), Mitsui (HSVSP, MLS-G), Nikko (RTCHP), Furukawa, ILSIN, and the like.

The copper foil includes all the copper foils prepared by a rolling method and an electrolytic method. Here, the copper foil may be subjected to rust-prevention treatment in order to prevent the surface thereof from being oxidized and corroded.

In the metal foil, a predetermined surface roughness (Rz) may also be formed on one surface contacting with a resin layer which the thermosetting resin composition is cured. In this case, the surface roughness (Rz) is not particularly limited, but may be, for example, in a range of 0.6 to 3.0 μm.

Furthermore, the thickness of the metal foil is not particularly limited, but may be less than 5 μm in consideration of the thickness and mechanical properties of a final product, and may be preferably in a range of 1 to 3 μm.

Further, a polymer film available in the present disclosure is not particularly limited as long as the polymer film is known as an insulation film in the art. Examples thereof include a polyimide film, an epoxy resin film, and the like, but are not limited thereto.

<Laminate and Printed Circuit Board>

The present disclosure includes a laminate formed by overlapping the aforementioned two or more prepregs, and then heating and pressurizing the overlapped prepregs under a typical condition.

Further, the present disclosure includes a copper foil laminate formed by laminating the prepreg and the copper foil, and heating, pressurizing, and molding the resulting product under a typical condition.

As an example, the aforementioned thermosetting resin composition is sufficiently stirred by using a stirrer at room temperature, impregnated in a glass substrate and dried, and then laminated with a copper foil, and the like, heat and pressure are applied to the resulting product, and then a desired copper foil laminate may be obtained. In this case, during the molding of the copper foil laminate, the heated and pressurized condition may be appropriately adjusted according to the thickness of a copper foil laminate to be prepared, or the type of thermosetting resin composition according to the present disclosure, and the like.

Furthermore, the present disclosure includes a printed circuit board laminated and molded by including one or more selected from the group consisting of the prepreg, an insulating resin sheet, and a resin-attached copper foil, preferably a multi-layer printed circuit board.

The printed circuit board in the present disclosure refers to a printed circuit board in which one or more layers are laminated by a plated through-hole method or a build-up method, and the like, and the printed circuit board may be obtained by superimposing and aligning the aforementioned prepreg or an insulating resin sheet with an inner layer wiring board, and heating, pressurizing, and molding the resulting product.

The printed circuit board may be prepared by a typical method known in the art. As a preferred example thereof, the printed circuit board may be prepared by laminating a copper foil on one surface or both surfaces of the prepreg according to the present disclosure and heating and pressurizing the resulting product to prepare a copper foil laminate, perforating holes in the copper foil laminate to perform a through hole plating, and then subjecting a copper foil including a plated film to etching treatment to form a circuit.

As described above, the prepreg and the printed circuit board may be prepared from the thermosetting resin composition according to the present disclosure. It could be seen that the prepreg and the printed circuit board had a low permittivity and a low dielectric loss as well as a low coefficient of thermal expansion (CTE), a high glass transition temperature (Tg), and excellent heat resistance (see the following Table 1). Accordingly, the prepreg and the printed circuit board of the present disclosure may be usefully utilized for parts of a printed circuit board for a network used in various electric and electronic devices such as a mobile communication device, which handles high-frequency signals of 1 GHz or more, or a base station device thereof, a network-related electronic device such as a server and a router, and a large computer.

Hereinafter, the present disclosure will be described in detail through Examples, but the following Examples and Experimental Examples only exemplify an embodiment of the present disclosure, and the scope of the present disclosure is not limited by the following Examples and Experimental Examples. Further, in the following description, "parts" mean "parts by mass".

Examples 1 to 3

1-1. Preparation of Thermosetting Resin Composition

A thermosetting resin composition was prepared by dissolving the poly(phenylene ether) in toluene according to the composition described in the following Table 1, and then mixing two or more cross-linking curing agents, a flame retardant, and an inorganic filler with the resulting solution, stirring the resulting product for 3 hours, and then adding an initiator thereto, and additionally stirring the resulting product for 1 hour. In the following Table 1, the unit for the amount of each composition used is a part by weight.

1-2. Preparation of Prepreg and Printed Circuit Board

A prepreg was prepared by impregnating the prepared resin composition in glass fiber surface-treated with a vinyl group-containing silane coupling agent, and then drying the impregnated glass fiber at 165° C. for about 3 to 10 minutes. Thereafter, a laminated thin plate having a thickness of 0.1 mm was prepared by laminating the prepreg as 1 ply, and then pressing the resulting product.

Comparative Examples 1 to 6

A resin composition, a prepreg, and a printed circuit board were prepared in the same manner as in the Examples, except for the composition described in the following Table 2. In the following Table 2, the unit for the amount of each composition used is a part by weight.

TABLE 1

|  | Example 1 | Example 2 | Example 3 |
|---|---|---|---|
| Allylate PPE | 40 | 40 | 40 |
| TAIC | 8 | 10 | 5 |
| 1,2-butadiene | 8 | 5 | 10 |
| 1,9-Decadiene | — | — | — |
| Di-(4-vinylbenzyl) ether | 2 | 2 | 2 |
| SBR | 3 | 2 | 2 |
| Flame retardant | 9 | 9 | 9 |
| Initiator | 2 | 2 | 2 |
| Inorganic filler surface-treated with amino silane | — | — | — |
| Inorganic filler surface-treated with vinyl silane | 30 | 30 | 30 |
| Epoxy Silane G/F | — | — | — |
| Vinyl Silane G/F | ○ | ○ | ○ |

1) Allylate PPE: MX-9000 (Number average molecular weight: 2,000 to 3,000)
2) 1,2-Butadiene: B-1000 (NIPPON SODA)
3) 1,9-decadiene: 1,9-decadiene (EVONIC)
4) Styrene-Butadiene: P-1500 (Asahi Kasei Chemical)
5) TAIC : TAIC (NIPPON KASEI CHEMICAL)
6) Di-(4-vinylbenzyl)ether: BPA-DAE (HAOHUA INDUSTRY)
7) Flame retardant: Saytex 8010 (Albemarle Asano Corporation)
8) Initiator: Perbutyl P (manufactured by NOF Corporation)
9) Inorganic filler: SC-5200SQ (manufactured by Admatechs)
10) Glass fiber (G/F): Asahi Kasei E glass Amino silane

TABLE 2

|  | Comparative Example | | | | | |
|---|---|---|---|---|---|---|
|  | 1 | 2 | 3 | 4 | 5 | 6 |
| Allylate PPE | 40 | 40 | 40 | 40 | 40 | 40 |
| TAIC | 8 | 5 | 7 | 7 | 10 | — |
| 1,2-butadiene | — | — | 7 | 7 | 5 | 14 |
| 1,9-Decadiene | 10 | 10 | — | — | — | — |
| Di-(4-vinylbenzyl) ether | — | 3 | 2 | 2 | 2 | 2 |
| SBR | — | — | 2 | 2 | 2 | 2 |
| Flame retardant | 10 | 10 | 10 | 10 | 9 | 10 |
| Initiator | 2 | 2 | 2 | 2 | 2 | 2 |
| Inorganic filler surface-treated with amino silane | — | — | 30 | — | — | — |
| Inorganic filler surface-treated with vinyl silane | 30 | 30 | — | 30 | 30 | 30 |
| Epoxy Silane G/F | ○ | ○ | ○ | ○ | — | — |
| Vinyl Silane G/F | — | — | — | — | ○ | ○ |

1) Allylate PPE: MX-9000 (Number average molecular weight: 2,000 to 3,000)
2) 1,2-Butadiene: B-1000 (NIPPON SODA)
3) 1,9-decadiene: 1,9-decadiene (EVONIC)
4) Styrene-Butadiene: P-1500 (Asahi Kasei Chemical)
5) TAIC: TAIC (NIPPON KASEI CHEMICAL)
6) Di-(4-vinylbenzyl)ether: BPA-DAE (HAOHUA INDUSTRY)
7) Flame retardant: Saytex 8010 (Albemarle Asano Corporation)
8) Initiator: Perbutyl P (manufactured by NOF Corporation)
9) Inorganic filler: SC-5200SQ (manufactured by Admatechs)
10) Glass fiber (G/F): Asahi Kasei E glass Amino silane Experimental Example 1—Physical Properties of Printed Circuit Board On the printed circuit boards prepared in Examples 1 to 3 and Comparative Examples 1 to 6, the following experiments were performed, and the results are shown in the following Table 3.

1) Measurement of Glass Transition Temperature (Tg)

The glass transition temperature was measured by DSC 2010 and DSC 2910 manufactured by TA Instruments. About 5 mg of a sample was heated to 300° C. at a rate of 10/min by using a DSC measuring device, and then cooled to 30° C. at a rate of 10/min. The first heating/cooling process was carried out twice as the same process.

2) Coefficient of Thermal Expansion (CTE)

Measurement of TMA glass transition temperature: The TMA glass transition temperature was evaluated by preparing an evaluation substrate at each side by 5 mm from an evaluation substrate from which a copper foil was removed by impregnating a copper foil laminate with a copper etching liquid, and using a TMA test device (TA Instrument, Q400) to observe thermal expansion characteristics of the evaluation substrate.

3) Heat Resistance

The heat resistance was evaluated by floating the printed circuit board at solder 288 in accordance with the IPC-TM-650 2.4.13 evaluation standard to measure the time point when a separation phenomenon occurred between the insulating layer and the copper foil, between the insulating layer and the metal core, or between the insulating layers.

4) Evaluation of Moisture-Absorption Heat Resistance (PCT)

The moisture-absorption heat resistance was evaluated by preparing an evaluation substrate from which a copper foil was removed by impregnating the copper foil laminate with a copper etching liquid, using an autoclave test device (ESPEC, EHS-411MD) to leave the evaluation substrate to stand under the conditions of 121° C. and 0.2 MPa for 4 hours, and then dipping the printed circuit board at solder 288 at an interval of 10 seconds to measure the time point when a separation phenomenon occurred between the insulating layer and the copper foil, between the insulating layer and the metal core, or between the insulating layers.

5) Relative Permittivity and Dielectric Loss Tangent

The relative permittivity and the dielectric loss tangent were measured at a frequency of 1 GHz by a relative permittivity measuring device (RF Impedance/Material Analyzer; Agilent) using a substrate from which a copper foil was removed by impregnating the copper foil laminate with a copper etching liquid.

6) Flame Retardancy

The flame retardancy was evaluated in accordance with the test method of UL94 (V method) by preparing an evaluation substrate with a length of 127 mm and a width of 12.7 mm from an evaluation substrate from which a copper foil was removed by impregnating the copper foil laminate with a copper etching liquid.

7) Copper Foil Adhesion (Peel Strength, P/S)

The copper foil adhesion was evaluated by lifting a circuit pattern formed on the printed circuit board in the 90° direction in accordance with the IPC-TM-650 2.4.8 evaluation standard to measure the time point when the circuit pattern (copper foil) was peeled off.

TABLE 3

|  | Example | | | Comparative Example | | | | | |
|---|---|---|---|---|---|---|---|---|---|
|  | 1 | 2 | 3 | 1 | 2 | 3 | 4 | 5 | 6 |
| DSC Tg (° C.) | 195 | 207 | 185 | 205 | 200 | 190 | 193 | 217 | 170 |
| CTE (%) | 2.0 | 1.9 | 2.1 | 2.6 | 2.5 | 2.4 | 2.2 | 1.8 | 2.8 |

TABLE 3-continued

|  | Example | | | Comparative Example | | | | | |
| --- | --- | --- | --- | --- | --- | --- | --- | --- | --- |
|  | 1 | 2 | 3 | 1 | 2 | 3 | 4 | 5 | 6 |
| Heat Resistance (S/F, @288° C.) | >10 min | >10 min | >10 min | 10 min | 10 min | >10 min | >10 min | >12 min | >15 min |
| PCT (4 hr) | OK | OK | OK | Fail | Fail | OK | OK | OK | Fail |
| Permittivity (Dk @ 1 GHz) | 3.60 | 3.62 | 3.63 | 3.77 | 3.70 | 3.75 | 3.70 | 3.80 | 3.72 |
| Dielectric loss (Df @ 1 GHz) | 0.0017 | 0.0019 | 0.0020 | 0.0026 | 0.0026 | 0.0025 | 0.0025 | 0.0027 | 0.0025 |
| Flame retardancy | V-0 | V-0 | V-0 | V-0 | V-0 | V-0 | V-0 | V-0 | V-0 |

As a result of the experiments, it could be confirmed that the thermosetting resin composition of the present disclosure had excellent low dielectric loss characteristics and a low permittivity, and simultaneously exhibited a high glass transition temperature (Tg), excellent heat resistance, low thermal expansion characteristics, high thermal stability, and the like (see Table 3).

The invention claimed is:

1. A thermosetting resin composition, the composition comprising:
   (a) a poly(phenylene ether) having two or more carbon-carbon double bonds at both ends of the molecular chain thereof, or an oligomer of the poly(phenylene ether);
   (b) two or more different cross-linking curing agents, and
   (c) a cross-linking curing agent which delays an initiation reaction,
   wherein the cross-linking curing agent (b) includes a cross-linking agent containing three or more functional groups (b1) and a cross-linking curing agent having a block structure and containing a styrene unit (b2).

2. The thermosetting resin composition of claim 1, further comprising:
   an inorganic filler surface-treated with a vinyl group-containing silane coupling agent.

3. The thermosetting resin composition of claim 1, wherein contents of the cross-linking agent containing three or more functional groups (b1) and the cross-linking curing agent having a block structure and containing a styrene unit (b2) are in a range of 1.65 to 15 wt % based on a total weight of the thermosetting resin composition, respectively.

4. The thermosetting resin composition of claim 1, wherein a ratio of the cross-linking agent containing three or more functional groups (b1) to the cross-linking curing agent having a block structure and containing a styrene unit (b2) is a weight ratio of 1 to 20:1.

5. The thermosetting resin composition of claim 1, wherein the poly(phenylene ether) resin (a) is represented by the following Formula 1:

in Formula 1,
Y is one or more compounds selected from the group consisting of bisphenol A, bisphenol F, bisphenol S, naphthalene, anthracene, biphenyl, tetramethyl biphenyl, phenol novolac, cresol novolac, bisphenol A novolac, and bisphenol S novolac compounds, and
m and n are each independently a natural number from 3 to 20.

6. The thermosetting resin composition of claim 1, wherein the poly(phenylene ether) resin (a) has a low molecular weight in which the number average molecular weight is in a range of 1,000 to 10,000.

7. The thermosetting resin composition of claim 1, wherein the molecular weight distribution of the poly(phenylene ether) resin is 3 or less (Mw/Mn≤3).

8. The thermosetting resin composition of claim 1, wherein the cross-linking agent containing three or more functional groups (b1) is selected from the group consisting of triallyl isocyanurate (TAIL) and 1,2,4-trivinyl cyclohexane (TVCH).

9. The thermosetting resin composition of claim 1, wherein the cross-linking curing agent having a block structure and containing a styrene unit (b2) is represented by the following Formula 4:

Formula 4

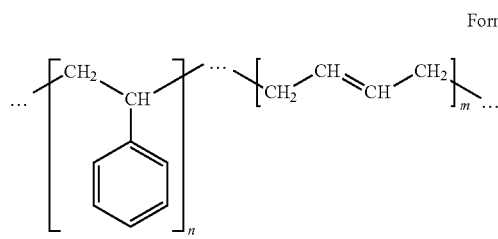

in Formula 4,
n is an integer from 5 to 20 and m is an integer from 5 to 20.

Formula 1

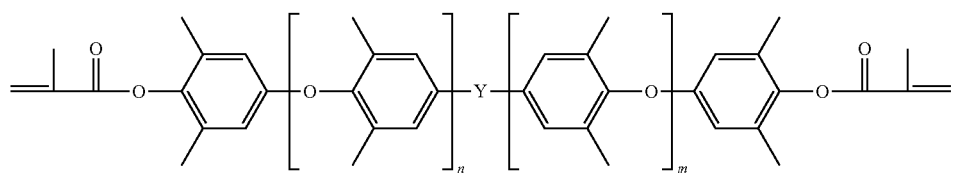

10. The thermosetting resin composition of claim 1, wherein a content of the cross-linking curing agent (b) is in a range of 5 to 40 wt % based on a total weight of the thermosetting resin composition.

11. The thermosetting resin composition of claim 1, wherein the cross-linking curing agent (b) further includes a hydrocarbon-based cross-linking agent (b3).

12. The thermosetting resin composition of claim 11, wherein the hydrocarbon-based cross-linking agent (b3) is a diene-based cross-linking agent.

13. The thermosetting resin composition of claim 11, wherein the hydrocarbon-based cross-linking agent (b3) is selected from the group consisting of butadiene, a polymer of butadiene, decadiene, a polymer of decadiene, octadiene, a polymer of octadiene, and vinyl carbazole.

14. The thermosetting resin composition of claim 11, wherein in the cross-linking curing agent (b), the hydrocarbon-based cross-linking agent (b3), the cross-linking agent containing three or more functional groups (b1) and the cross-linking curing agent having a block structure and containing a styrene unit (b3) are contained in a weight ratio of b1:b2:b3=1 to 20:1 to 20:1.

15. The thermosetting resin composition of claim 11, wherein a content of the hydrocarbon-based cross-linking agent (b3) is in a range of 1.65 to 15 wt % based on a total weight of the thermosetting resin composition.

16. The thermosetting resin composition of claim 1, further comprising:
one or more selected from the group consisting of a flame retardant, and a reaction initiator.

17. The thermosetting resin composition of claim 16, wherein the flame retardant is one or more selected from the group consisting of a halogen-containing flame retardant, a phosphorus-based flame retardant, an antimony-based flame retardant, and a metal hydroxide.

18. The thermosetting resin composition of claim 16, wherein the cross-linking curing agent which delays an initiation reaction includes di-(4-vinylbenzyl)ether.

19. The thermosetting resin composition of claim 16, wherein a content of the cross-linking curing agent which delays an initiation reaction is in a range of 1 to 10 wt % based on a total weight of the thermosetting resin composition.

20. The thermosetting resin composition of claim 16, wherein the reaction initiator is selected from the group consisting of α,α'-bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoxyquinone, chloranil, 2,4,6-tri-t-butylphenoxyl, t-butylperoxyisopropyl monocarbonate, azobisisobutylonitrile, and a metal carboxylate salt.

21. The thermosetting resin composition of claim 16, wherein a content of the reaction initiator is in a range of 2 to 5 parts by weight based on 100 parts by weight of the poly(phenylene ether) resin (a).

22. A prepreg comprising:
a fibrous substrate which is surface-treated with a vinyl group-containing silane coupling agent; and
the thermosetting resin composition of claim 1 is impregnated in the fibrous substrate.

23. The prepreg of claim 22, which has a permittivity (Dk) of 3.6 to 3.63 at 1 GHz, and a dielectric loss (Df) of 0.0017 to 0.0020 at 1 GHz.

24. The prepreg of claim 22, wherein the fibrous substrate comprises one or more selected from the group consisting of glass fiber, glass paper, glass fiber nonwoven fabric (glass web), glass cloth, aramid fiber, aramid paper, polyester fiber, carbon fiber, inorganic fiber, and organic fiber.

25. A functional laminated sheet comprising:
a metal foil or a polymer film substrate; and
a resin layer which is formed on one surface or both surfaces of the substrate and cured by the thermosetting resin composition of claim 1.

26. A printed circuit board laminated and molded by comprising one or more layers of the prepreg of claim 22.

* * * * *